United States Patent
Lai et al.

(10) Patent No.: US 11,705,349 B2
(45) Date of Patent: Jul. 18, 2023

(54) TRANSFER SUBSTRATE FOR COMPONENT TRANSFERRING AND MICRO LEDS CARRYING SUBSTRATE

(71) Applicant: PLAYNITRIDE INC., Tainan (TW)

(72) Inventors: Yu-Hung Lai, Tainan (TW); Tzu-Yang Lin, Tainan (TW); Yun-Li Li, Tainan (TW)

(73) Assignee: PlayNitride Inc., Tainan (TW)

( * ) Notice: Subject to any disclaimer, the term of this patent is extended or adjusted under 35 U.S.C. 154(b) by 88 days.

(21) Appl. No.: 16/387,395

(22) Filed: Apr. 17, 2019

(65) Prior Publication Data

US 2019/0326143 A1 Oct. 24, 2019

(30) Foreign Application Priority Data

Apr. 18, 2018 (TW) ................................. 107113115

(51) Int. Cl.
*H01L 21/67* (2006.01)
*H01L 25/075* (2006.01)

(52) U.S. Cl.
CPC .... *H01L 21/67144* (2013.01); *H01L 25/0753* (2013.01)

(58) Field of Classification Search
CPC ........... H01L 21/67144; H01L 21/6835; H01L 24/75; H01L 24/95; H01L 25/0753
See application file for complete search history.

(56) References Cited

U.S. PATENT DOCUMENTS

| | | | |
|---|---|---|---|
| 2013/0130440 A1* | 5/2013 | Hu | H01L 24/95 438/107 |
| 2013/0270578 A1* | 10/2013 | Kramer | H01L 23/3738 257/77 |
| 2015/0076528 A1* | 3/2015 | Chan | H01L 24/29 438/34 |
| 2016/0020130 A1* | 1/2016 | Bower | H01L 23/293 438/126 |
| 2016/0336304 A1* | 11/2016 | Wu | H01L 27/1214 |
| 2017/0215280 A1 | 7/2017 | Chaji | |
| 2017/0330867 A1 | 11/2017 | Zou et al. | |
| 2019/0319164 A1* | 10/2019 | Zou | H01L 24/83 |

FOREIGN PATENT DOCUMENTS

WO 2018038153 A1 8/2017

* cited by examiner

*Primary Examiner* — Vongsavanh Sengdara
(74) *Attorney, Agent, or Firm* — JCIPRNET

(57) ABSTRACT

A transfer substrate is configured to transfer a plurality of micro components from a first substrate to a second substrate. The transfer substrate comprises a base and a plurality of transfer heads. The base includes an upper surface. The plurality of transfer heads is disposed on the upper surface of the base, wherein each transfer head includes a first surface and a second surface opposite to each other and the transfer heads contact the base with the first surfaces thereof. A plurality of adhesion lumps is separated from each other, wherein each adhesion lump is disposed on the second surface of one of the transfer heads. A CTE of the base is different from CTEs of the transfer heads.

16 Claims, 4 Drawing Sheets

TRANSFER SUBSTRATE FOR COMPONENT TRANSFERRING AND MICRO LEDS CARRYING SUBSTRATE

CROSS-REFERENCE TO RELATED APPLICATIONS

This non-provisional application claims priority under 35 U.S.C. § 119(a) on Patent Application No(s). 107113115 filed in Taiwan, R.O.C. on Apr. 18, 2018, the entire contents of which are hereby incorporated by reference.

TECHNICAL FIELD

This disclosure is related to a transfer substrate for component transferring and a micro LEDs carrying substrate, particularly to a transfer substrate for component transferring and a micro LEDs carrying substrate including micro structure on their surface.

BACKGROUND

Light emitting diodes (LEDs) are widely used in various area as light emitting component with high efficiency. In a common used light emitting component producing, N-type semiconductor layer, light emitting layer, P-type semiconductor layer and electrodes are formed sequentially on an epitaxy substrate via epitaxy growth to obtain light emitting components.

When the sizes of light emitting components are reduced to micrometer (μm) scale to form micro light emitting components and is applied to display devices, light emitting array comprising a plurality of light emitting components are arranged on display panels to serve as light source of display devices. In one way, micro light components are formed on the epitaxy substrate at first, then are removed from the epitaxy substrate by a transfer substrate for the removed light emitting components to be disposed on the display panel. Mass transferring and process efficiency raise are achieved thereby. Furthermore, mass transferring is also acquired for raising process efficiency for micro electronic component produced for cooperation with the micro light emitting components.

Generally speaking, during the transferring, the transfer substrate for component transferring is heated in some processes to temporarily fix the micro light emitting component on the transfer substrate or to release the micro light emitting components for disposing the micro light emitting components on the display panel. However, when the transfer substrate is heated, the structure of the transfer substrate may expand while being heated, lowering the alignment accuracy of the structures on the substrate to the micro light emitting components on the epitaxy substrate or the alignment accuracy of the micro light emitting component to the driving circuit on the display panel. The dis-alignment results bothers corresponding processes and reduces the overall yields.

SUMMARY

According to one or more embodiment of this disclosure, a transfer substrate for component transferring is configured to transfer a plurality of micro components from a first substrate to a second substrate The transfer substrate comprises a base and a plurality of transfer heads The base includes an upper surface. The plurality of transfer heads is disposed on the upper surface of the base, with each transfer head including a first surface and a second surface opposite to each other, wherein the transfer heads contact the base with the first surfaces thereof. A coefficient of thermal expansion (CTE) of the base is different from CTEs of the transfer heads, with a difference between the CTE of any one of the transfer heads and a CTE of any one of the micro components is less than another difference between the CTE of the base and the CTE of any one of the transfer heads.

According to one or more embodiment of this disclosure, a micro LEDs carrying substrate comprises a base, a plurality of transfer heads, an adhesion layer and a plurality of micro components. The base includes an upper surface. The plurality of transfer heads is disposed on the upper surface of the base, with each transfer head including a first surface and a second surface opposite to each other, wherein the transfer heads contact the base with the first surfaces thereof. The adhesion layer is disposed on the second surfaces of the transfer heads. The plurality of micro components disposed on the adhesion layer, wherein each micro component is fixed to a respective one of the transfer heads via the adhesion layer. A CTE of the base is different from CTEs of the transfer heads, with a difference between the CTE of any one of the transfer heads and a CTE of any one of the micro components is less than another difference between the CTE of the base and the CTE of any one of the transfer heads.

BRIEF DESCRIPTION OF THE DRAWINGS

The present disclosure will become more fully understood from the detailed description given hereinbelow and the accompanying drawings which are given by way of illustration only and thus are not limitative of the present disclosure and wherein.

DETAILED DESCRIPTION

Figure 1:
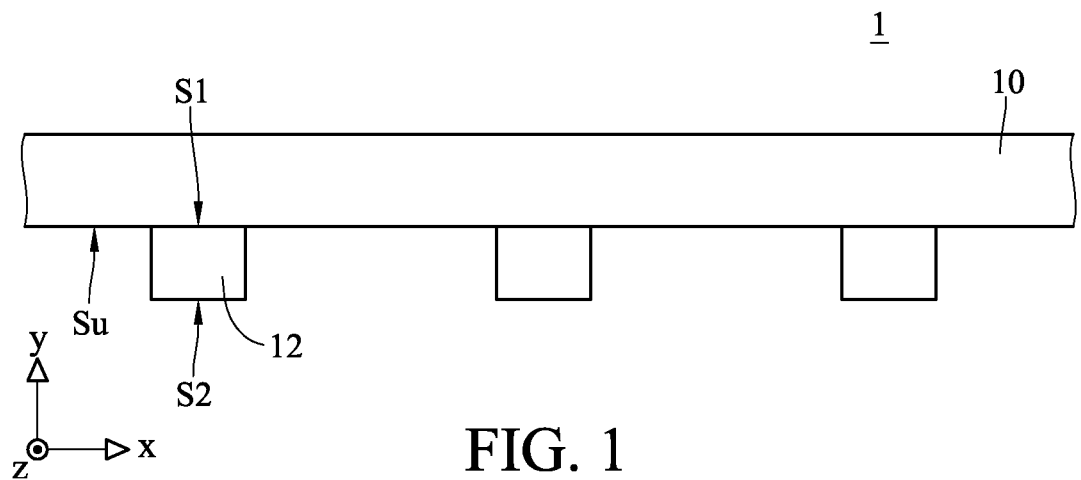
FIGS. 1-5 are structure diagrams of transfer substrates for component transferring according to embodiment described herein.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

A transfer substrate for component transferring can be configured to transfer a plurality of micro components on a first substrate to a second substrate. Said first substrate is, for example, an epitaxy substrate, configured to form corresponding structures of micro components, such as micro LEDs, thereon. Said second substrate is, for example, a display panel. The relative details of the first substrate, the second substrate and the micro components will be explained in the following.

Please refer to FIG. 1, wherein FIG. 1 is a structure diagram of a transfer substrate for component transferring according to an embodiment in this disclosure. The transfer substrate 1 comprises a base 10 and a plurality of transfer heads 12. The base 10 has an upper surface Su. The transfer pieces 12 are disposed on the upper surface Su of the base 10 and apart from each other. In a preferable way, the transfer heads 12 are arranged in an array and the intervals between the neighbor transfer heads 12 are the same. For example, any adjacent two of the transfer heads 12 are arranged with a distance d2 therebetween in the X direction.

Each transfer head 12 includes a first surface S1 and a second surface S2 opposite to each other. The transfer heads 12 contact the base 10 with the first surfaces S1 thereof. In this embodiment, the transfer heads 12 are fixed to the upper surface Su of the base 10 by their first surface S1.

On the other hand, a difference between the CTE of any one of the transfer heads 12 and a CTE of the micro components to be transferred is less than another difference between the CTE of the base 10 and the CTE of the transfer heads 12. In a preferably way, in one embodiment, the difference between the CTE of the base 10 and the CTE of the transfer heads 12 is not larger than 50 percent of the CTE of the base 10 and is not less than 10 percent of the CTE of the base 10. In a better way, the base 10 and the plurality of transfer heads 12 are formed by different materials while the plurality of the transfer heads 12 and the micro components to be transferred are formed by similar materials. Generally speaking, the transferring of the micro components usually involves heating processes and pressing processes. Thus, the transfer substrate 1 might be warped due to the force induced by the processes in the transferring and the warp degree might even increase, or the transfer heads 12 might be damaged or shifted due to the force between the transfer heads 12 and the base 10 enhanced by the heating or the pressure, reducing the process yields. Apparently, a warped substrate can result in negative effects to said transferring.

In one embodiment, the thermal conductivity of any one of the transfer heads 12 is larger than the twice of the thermal conductivity of the base 10. The thermal energy can be concentrated to the transfer heads 12 while heating the transfer substrate 1 by using a material with appropriate thermal conductivity, smoothing the transferring. In a preferable way, the thermal conductivities of transfer heads 12 are between twice of the thermal conductivity of the base 10 and five times of the thermal conductivity of the base 10, saving the heating time for the transfer substrate 1. In one embodiment, the material of each transfer head 12 is an inorganic material. For example, the base 10 can be a sapphire base and the micro components can be structures of micro light emitting diodes.

Figure 2A:
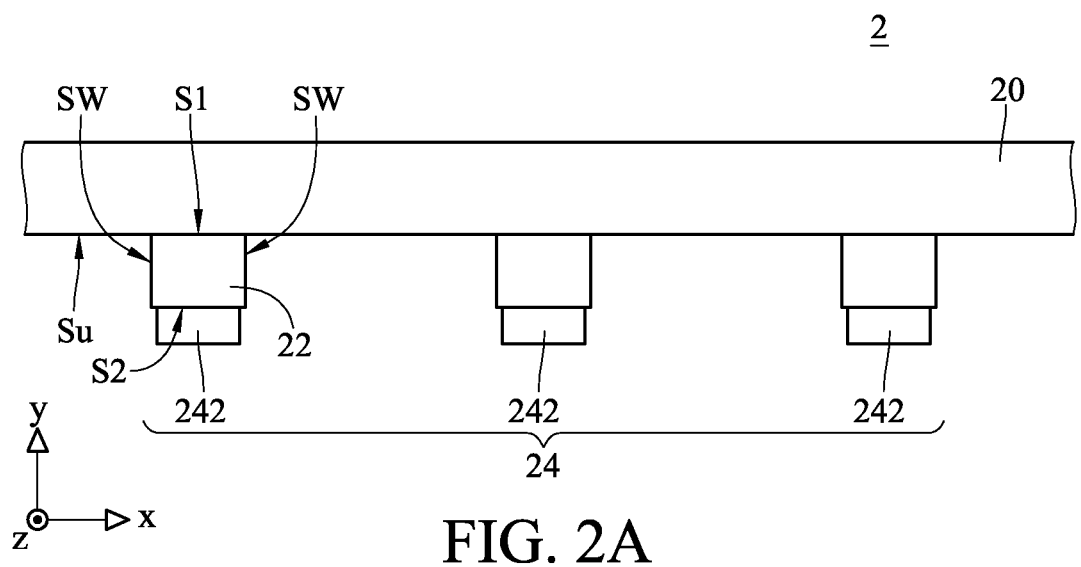

Next, please refer to FIG. 2A, wherein FIG. 2A is a structure diagram of a transfer substrate according to another embodiment in this disclosure. In the embodiment shown in FIG. 2A, the structure of the transfer substrate 2 is similar to the structure of the transfer substrate 1. The transfer substrate 2 includes a base 20 and a plurality transfer heads 22 disposed on the base 20. The similar details are not repeated. The difference between the transfer substrate 1 and the transfer substrate 2 is that the transfer substrate 2 further includes an adhesion layer 24. The adhesion layer 24 includes a plurality of adhesion lumps 242, disposed apart from each other. The adhesion lumps are located on the second surface S2 of a respective one of the transfer heads 22. In one embodiment, the adhesion lumps 242 are, for example, defined by patternization processes after a layer of adhesion material is coated on the base 20. In another embodiment, the adhesion lumps 242 are formed by dipping the transfer heads 12 of the transfer substrate 1 with corresponding material. In further another embodiment, the adhesion lumps 242 are formed on the second surfaces of the transfer heads respectively by dispensing. The material of the adhesion lumps 242 can be black photoresist, opaque glues, multi-layered chromium film or resin.

In one embodiment, each adhesion lump 242 is located on the second surface S2 of a respective one of the transfer heads 22 and is within the edge of the corresponding second surface S2. Said edge of the second surface S2 can be understood as the borderline of the second surface S2 or the intersection of the second surface S2 and a sidewall SW of the transfer head 22. From another aspect, each adhesion lump 242 covers a part of the second surface S2 of the corresponding transfer head 22, with the corresponding sidewall SW is not covered by the adhesion lump 242.

Beside the example exemplified by FIG. 2A, in another similar embodiment, the edge of each adhesion lumps 242 is in alignment with the edge of the corresponding second surface S2. Thus, the area of the second surfaces S2 of the transfer heads 22 are well utilized and the surface area of the transfer substrate 2 configured to adhere the micro components is increased.

Figure 2B:
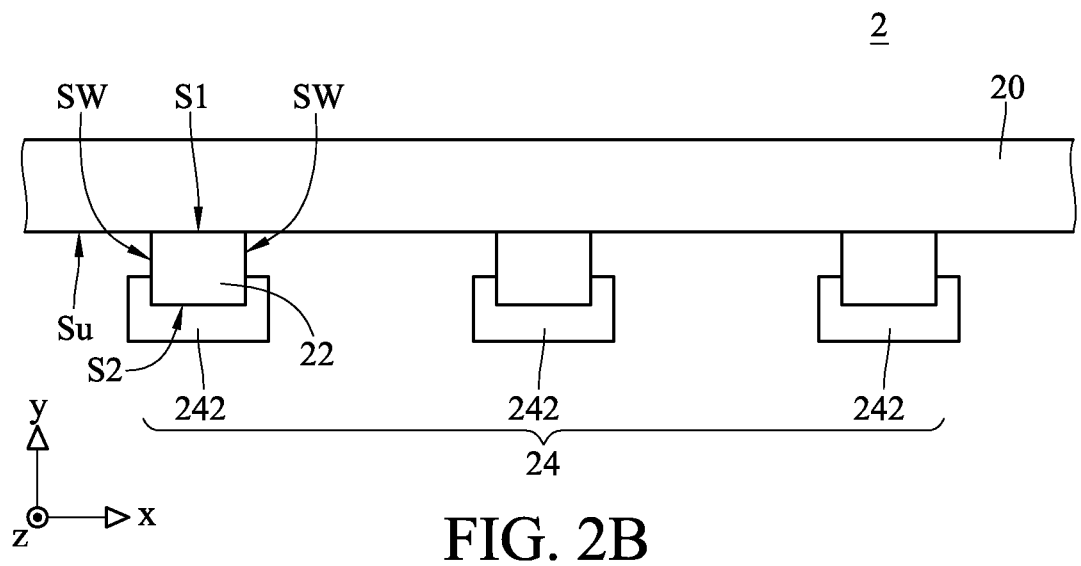

In another similar embodiment, as shown in FIG. 2B (FIG. 2B is a structure diagram of a transfer substrate according to another embodiment in this disclosure), each adhesion lump 242 further extends and covers at least a part of the side wall SW of the corresponding transfer head 22 in addition to covering the corresponding second surface S2. For another aspect, each adhesion lump 242 covers the entire second surface S2 of the corresponding transfer head 22 and each adhesion lump 242 is beyond the edge of the second surface S2 and extends toward the base 20 along the y axis, contacting a part of the side wall of the corresponding transfer head 22. Thus, in addition to well utilizing the second surfaces of the transfer heads 22 to increase the surface area of the transfer substrate 2 for adhering the micro components during, each adhesion lump 242 can be adhered to the respective one of the transfer heads 22 more firmly.

Figure 3A:
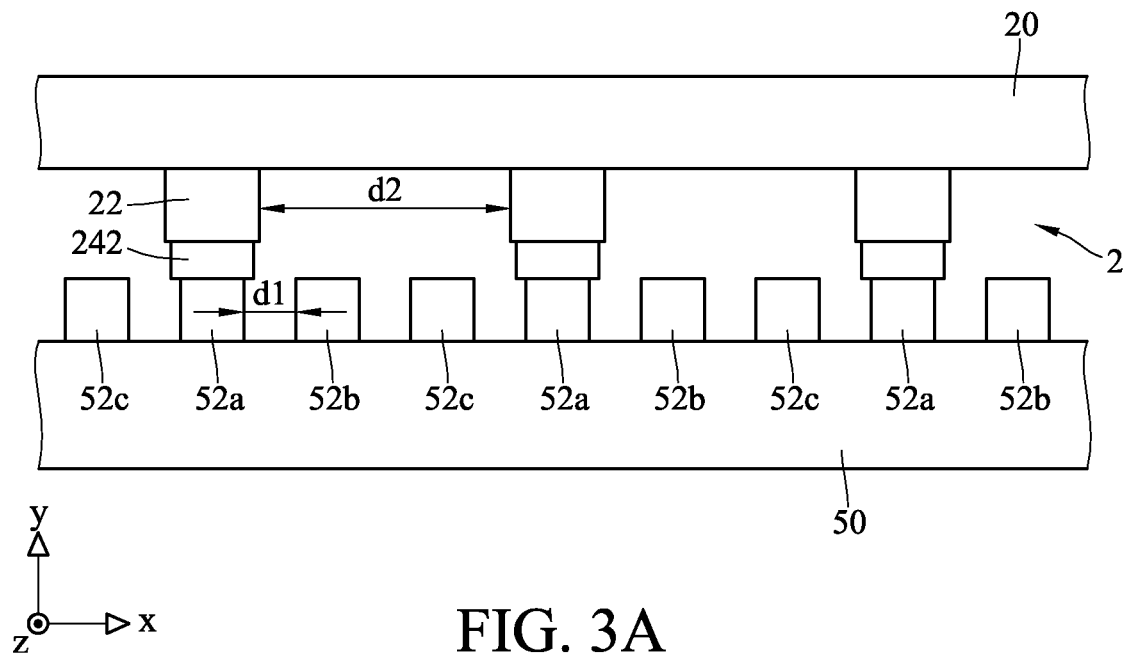
Figure 3B:
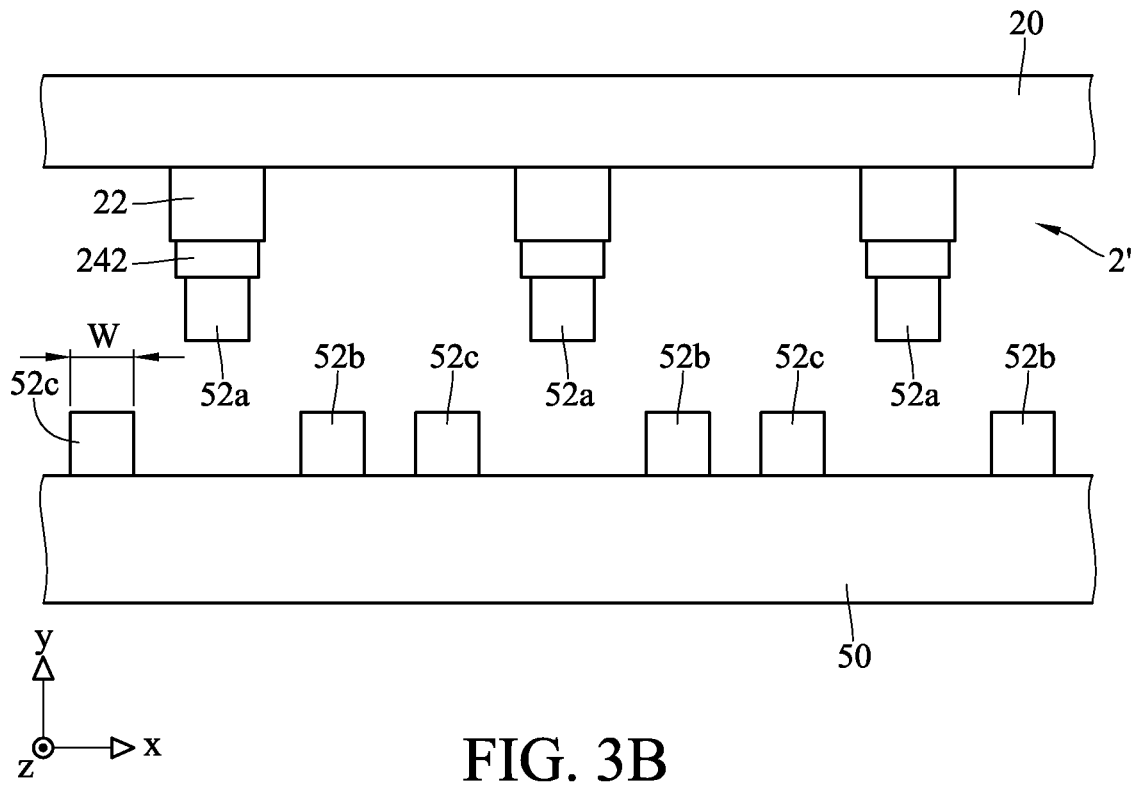
Figure 3C:
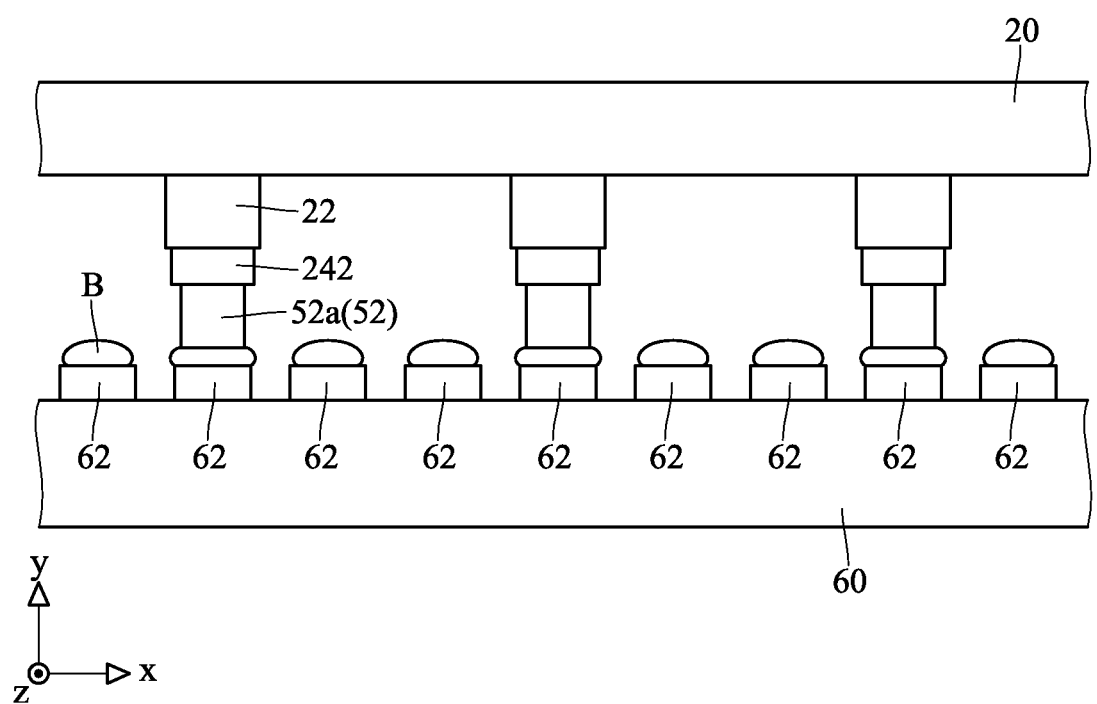

Please refer to FIG. 3A to FIG. 3C, wherein FIG. 3A to FIG. 3C are configured to clearly illustrate how the transfer substrate is utilized to make the design consideration of the corresponding component. FIG. 3A is a diagram for the transfer substrate and a first substrate in the transferring of micro components according to another embodiment in this disclosure. FIG. 3B is a diagram for the transfer substrate and the first substrate in the transferring of micro components according to another embodiment in this disclosure. FIG. 3C is a diagram for the transfer substrate and a second substrate in the transferring of micro components according to another embodiment in this disclosure. The transfer substrate 2 in FIG. 2A is exemplified in FIG. 3A to FIG. 3C. Moreover, a first substrate 50 and micro component 52a, 52b, 52c thereon are illustrated in FIG. 3A and FIG. 3B while a second substrate 60 and a driving circuit 62 thereon are illustrated in FIG. 3C.

As shown in FIG. 3A, a plurality of micro components 52 is disposed on the first substrate 50. The micro components 52a, 52b, 52c are exemplified but the number and the arrangement of the micro component is not limited thereto. Said micro component 52a, 52b, 52c may be micro light emitting diode (micro LED) including a P-type doping layer, a N-type doping layer, a light emitting layer and an electrode layer. The above are for exemplification only while the actual implementation of a micro light emitting diode is not limited thereto. In other embodiments, micro components may be electronic components, such as micro chips or micro sensors, acquiring mass transfer in their processes.

The micro components 52a, 52b, 52c are on the first substrate 50 and are arranged along the x axis direction shown in the figure, with each being apart from a neighbor one by a first distance d1. On the contrary, the transfer heads 22 are on the base 20 and are arranged along the x axis direction shown in the figure, with each being apart from a neighbor one by a second distance d2. The second distance d2 is different from the first distance d1. In this embodiment, the second distance d2 is larger than the sum of the first distance d1 and the width W of each micro component 52 for implementing selective pick-up adapted to adjust the intervals between the transferred micro components 52 form the first substrate 50 to the second substrate 60. In practice, the transfer substrate 2 is utilized to transfer the micro light emitting diodes configured to provide lights in the same color to the substrate of a display panel, with the micro light emitting diodes providing lights in the same color belonging to different pixels respectively. Therefore, the second distances d2 are related to the relative distances between the pixels on the display panel.

In the phase shown in FIG. 3A and FIG. 3B, the adhesion lumps 242 contact the respective ones of the micro components 52a on the first substrate 50. Then, the transfer substrate 2 and the first substrate 50 are heated and other required processes are performed so that the micro components are adhered to the respective ones of the adhesion lumps 242 and depart from the first substrate 50, with the adhered micro components 52a temporarily fixed on the transfer substrate 2 (as shown in FIG. 3B) and thus becoming a micro LEDs carrying substrate 2'.

And then, as shown in FIG. 3C, the micro LEDs carrying substrate 2' is abutted to the second substrate 60, and the micro components are bonded to the driving circuit 62 on the second substrate 60. For the practical equipment operation, the micro LEDs carrying substrate 2' can be the one moved to abut to the second substrate 60; alternatively, it can be the second substrate 60 as the moved one to be disposed at an appropriate location for the abutting of the micro LEDs carrying substrate 2'. Then, the base 20 and the second substrate 60 are heated and other required processes are performed, with the micro components 52a departing from the transfer substrate 2 and fixed on default locations on the second substrate 60 via a bump B, wherein the micro components 52a are electrically connected to the driving circuit 62 on the second substrate 60 through the bumps B respectively. In the figure of this embodiment, the driving circuits 62 are exemplified as individual circuits, but, practically, the driving circuits 62 can also be in form of an integrated circuit electrically connected to the micro components. The ways for carrying out the above embodiments can also be applied to other embodiments.

By repeating the above steps, the remaining micro components 52b, 52c on the first substrate 50 are transferred to the second substrate 60 sequentially and then are electrically connected to the driving circuit 62 on the second substrate 60. In this embodiment, the micro components 52a, 52b, 52c are micro light emitting diodes and a display panel utilizing micro light emitting diodes configured to provide light according to driving signals provided by the driving circuits 62 on the second substrate 60 can thus be implemented.

During the transferring, heating is usually performed while picking up or bonding the micro components. The thermal energy is usually concentrated to the transfer heads 22, and thus the deformation of the transfer heads 22 due to thermal expansion may cause more influence on the location shifts of the transfer heads 22 than the base 20 do with thermal expansion. In one embodiment, the difference between the CTE of each micro component and the CTE of each transfer head 22 is less than a default threshold. In this embodiment, the base 20 and the first substrate 50 may comprise same material (sapphire for example) and the transfer head 22 and the micro component 52 comprise same material (GaN epitaxial layer for example). In one embodiment, the difference between the CTE of each micro component and the CTE of each transfer head 22 is not larger than 10 percent of the CTE of the micro component. Thus, the location shifts on the base 20 of the transfer heads 22 due to thermal expansion approximate to the location shifts on the first substrate 50 of the micro component 52. In other words, the transfer heads 22 on the base 20 can be kept aligning to the micro components 52 on the first substrate 50 by choosing the CTE of each transfer head 22 appropriately and the process yields of the micro components 52 can be thus raised.

Figure 4:
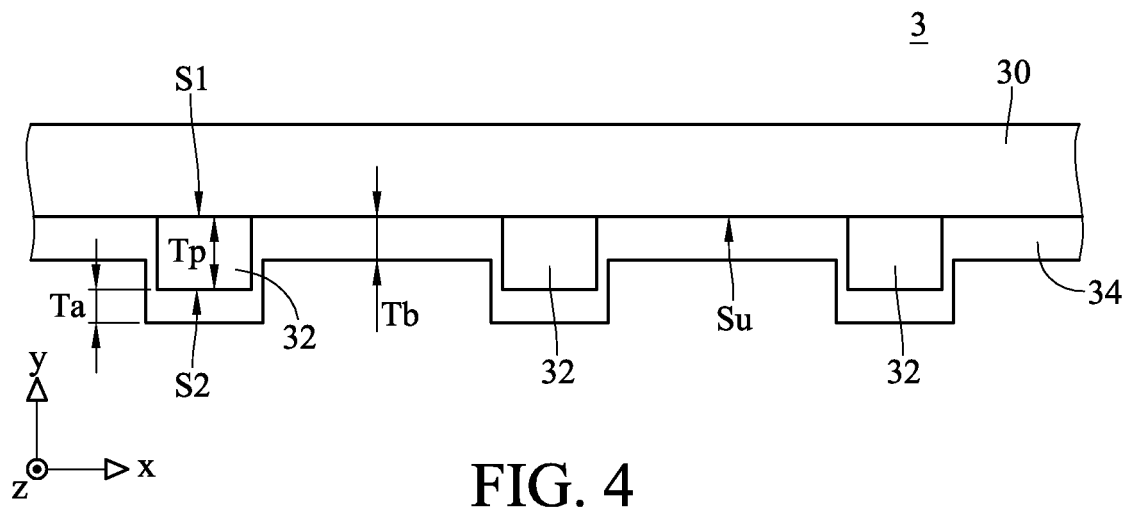

Please refer to FIG. 4, wherein FIG. 4 is a structure diagram of the transfer substrate according to further another embodiment in this disclosure. In the embodiment shown in FIG. 4, the structure of the transfer substrate 3 is similar to the structure of the transfer substrate 1. The transfer substrate 3 includes a base 30 and a plurality of transfer heads 32 disposed on the base 30. The similar details are not repeated herein. The difference between the transfer substrate 3 and the above embodiments is that the transfer substrate 3 further includes an adhesion layer 34. The adhesion layer 34 is disposed on the transfer head 32 and on the upper surface Su of the base 30. The adhesion layer 34 can be disposed by coating or spin-coating in the semiconductor processes, or the adhesion layer can be formed by sticking or dipping relative material. In this embodiment, the adhesion layer 34 is formed on the base 30 and the transfer heads 32 by coating, wherein the thickness Tb of a part of the adhesion layer 34 on the upper surface Su is larger than the thickness Ta of a part of the adhesion layer 34 on the second surface S2. Besides, the thickness Ta is less than the thickness Tp of each transfer head 32. The ratio between the thickness Tp and the thickness Ta is not less than 1.5 and is not larger than 15. It frequently happens that neighbor micro components are unintentionally adhered to other components during the picking-up process if the thickness Tp is too small. On the other hand, the heating is not effective and the process efficiency is thus reduced if the thickness Tp is too large. In one embodiment, the thickness Tp and the thickness Ta are 4.5 micrometer and 2.5 micrometer respectively. In another example, the thickness Tp and the thickness Ta are 10 micrometer and 2.5-5 micrometer respectively. In further another embodiment, the thickness Tp and the thickness Ta are 30 micrometer and 2.5-5 micrometer respectively.

Figure 5:
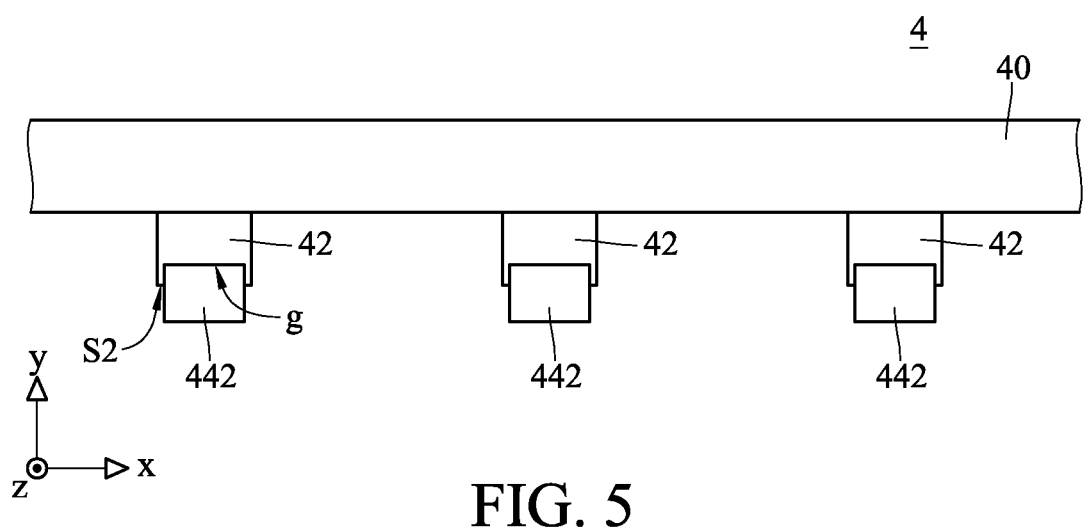

Please refer to FIG. 5, wherein FIG. 5 is a structure diagram of the transfer substrate 4 according to further another embodiment in this disclosure. The structure of the transfer substrate 4 is similar to the structure of the mentioned transfer substrate 2. The transfer substrate 4 comprises a base 40, a plurality of transfer heads 42 disposed on the base 40 and a plurality of adhesion lumps 442 which are separated from each other. Each adhesion lump 442 is on the second surface S2 of the respective one of the transfer heads 42. Relevant details are not repeated herein. The difference between the transfer substrate 4 and the other embodiments is that a cavity g is formed at the second surface S2 of each transfer head 42. At least a part of each adhesion lump 442 is in a respective one of the cavities. Thus, each adhesion lump 442 is attached to the respective one of the transfer heads more firmly.

As referring to the relative description of FIG. 3B and the micro LEDs carrying substrate, any person having ordinary skill in the art can realize that the implementation disclosed in the embodiments in FIG. 4 and FIG. 5 can be applied to other embodiments with this disclosure. Relevant details are not repeated herein.

In view of the above, this disclosure provides a transfer substrate for component transferring and a micro LEDs carrying substrate. The transfer substrate and the micro LEDs carrying substrate have similar structures. The transfer substrate is configured to transfer the micro components (especially micro light emitting diode) from the first substrate to the second substrate. In view of the transfer substrate, the CTE of the base of the transfer substrate is different from the CTEs of the plurality of transfer heads, which means said base comprises a material different from the materials the transfer heads comprise. Besides, the differences between the CTE of the transfer head and the micro components are less than the difference between the CTE of the base and the CTE of any one of the transfer heads. The transfer substrate is usually heated together with the first substrate so that the thermal expansion of the first substrate usually occurs together with the thermal expansion of the transfer substrate. With the transfer substrate provided by this disclosure, the micro structures can be precisely aligned to the micro components on the first substrate, and thus the micro components can be removed from the first substrate smoothly and precisely. Furthermore, it can be regarded that the micro LEDs carrying substrate is a transfer substrate temporarily carrying the micro components. By the above structure, the micro components on the micro LEDs carrying substrate can be aligned to the second substrate precisely and thus the micro components can be bonded to the connection point on the second substrate, raising the overall yields.

What is claimed is:

1. A transfer substrate, configured to transfer a plurality of micro components from a first substrate to a second substrate, comprising:
    a base including an upper surface;
    a plurality of transfer heads, disposed on the upper surface of the base, wherein each transfer head includes a first surface and a second surface opposite to each other and the transfer heads contact the base with the first surfaces thereof; and
    a plurality of adhesion lumps, separated from each other, wherein each adhesion lump is disposed on the second surface of one of the transfer heads and contacts one of the micro components and said one of the transfer heads, and each adhesion lump adheres to one of the micro components, and each adhesion lump is located between one of the transfer heads and one of the micro components;
    wherein the material of the plurality of adhesion lumps is organic polymer,
    wherein a Coefficient of Thermal Expansion (CTE) of the base is different from CTEs of the transfer heads,
    the base and the plurality of transfer heads are different materials, and
    a width of each adhesion lump in a X direction is smaller than a width of the second surface of the respective transfer head in the X direction and is greater than a width of each of the plurality of micro components; and
    the plurality of transfer heads and the plurality of adhesion lumps are different materials.

2. The transfer substrate according to claim 1, wherein a thermal conductivity of each transfer head is larger than twice of a thermal conductivity of the base and is less than five times of the thermal conductivity of the base.

3. The transfer substrate for component transferring according to claim 1, wherein the base is a sapphire substrate and the transfer heads comprise gallium nitride.

4. The transfer substrate according to claim 1, wherein a difference between the CTE of each transfer head and the CTE of the base is not larger than 50 percent of the CTE of the base and is not less than 10 percent of the CTE of the base.

5. The transfer substrate according to claim 1, wherein a difference between the CTE of any one of the transfer heads and a CTE of any one of the micro components is less than another difference between the CTE of the base and the CTE of any one of the transfer heads.

6. The transfer substrate according to claim 1, wherein a cavity is formed at the second surface of each transfer head and each adhesion lump is located in the cavity of the respective transfer head.

7. A transfer substrate, configured to transfer a plurality of micro components from a first substrate to a second substrate, comprising:
    a base including an upper surface;
    a plurality of transfer heads, disposed on the upper surface of the base, wherein each transfer head includes a first surface and a second surface opposite to each other and the transfer heads contact the base with the first surfaces thereof; and
    an adhesion layer, disposed on the transfer heads for covering the second surface of the transfer heads and the upper surface of the base and contacting the micro components and the transfer heads, wherein the adhesion layer adheres to the micro components, and the adhesion layer is located between the transfer heads and the micro components;
    wherein the material of the adhesion layer is organic polymer and the adhesion layer adheres to one of the micro components,
    wherein a Coefficient of Thermal Expansion (CTE) of the base is different from CTEs of the transfer heads, and
    the base and the plurality of transfer heads are different materials, and
    the plurality of transfer heads and the adhesion layer are different materials.

8. The transfer substrate according to claim 7, wherein a thickness of a part of the adhesion layer on the upper surface is larger than a thickness of another part of the adhesion layer on each second surface.

9. The transfer substrate according to claim 7, wherein the base is a sapphire substrate and the transfer heads comprise gallium nitride.

10. A micro LEDs carrying substrate, comprising:
    a base including an upper surface;
    a plurality of transfer heads, disposed on the upper surface of the base, wherein each transfer head includes a first surface and a second surface opposite to each other and the transfer heads contact the base with the first surfaces thereof;
    an adhesion layer, disposed on the second surfaces of the transfer heads; and
    a plurality of micro components disposed on the adhesion layer, wherein each micro component comprises an epitaxial layer and is fixed to a respective one of the transfer heads via the adhesion layer;
    wherein the material of the adhesion layer is organic polymer,
    wherein a Coefficient of Thermal Expansion (CTE) of the base is different from CTEs of the transfer heads, and
    the base and the plurality of transfer heads are different materials, and
    wherein the base is a sapphire substrate, the transfer heads comprise gallium nitride and the epitaxial layers of the micro components comprise gallium nitride, and
    the plurality of transfer heads and the adhesion layer are different materials.

11. The micro LEDs carrying substrate according to claim 10, wherein the difference between the CTE of each transfer head and the CTE of the base is not larger than 50 percent of the CTE of the base and is not less than 10 percent of the CTE of the base.

12. The micro LEDs carrying substrate according to claim 10, wherein the adhesion layer comprises a plurality of adhesion lumps separated from each other, wherein each adhesion lump is disposed on the second surface of one of the transfer heads.

13. The micro LEDs carrying substrate according to claim 12, wherein a cavity is formed at the second surface of each transfer head and each adhesion lump is located in the cavity of the second surface of the respective transfer head.

14. The micro LEDs carrying substrate according to claim 10, wherein the adhesion layer covers the transfer heads and the upper surface of the base.

15. The micro LEDs carrying substrate according to claim 14, wherein a thickness of a part of the adhesion layer on the upper surface is larger than a thickness of another part of the adhesion layer on each second surface.

16. The micro LEDs carrying substrate according to claim 10, wherein a sum of a thickness of a part of the adhesion layer contacting the second surface of one of the transfer heads and a thickness of said one of the transfer heads is larger than a thickness of another part of the adhesion layer contacting the upper surface of the base.

\* \* \* \* \*